United States Patent [19]

Warwick

[11] Patent Number: 5,793,093

[45] Date of Patent: Aug. 11, 1998

[54] SUBSTRATE ISOLATION FOR ANALOG/DIGITAL IC CHIPS

[75] Inventor: Colin Alan Warwick, Holmdel, N.J.

[73] Assignee: Lucent Technologies Inc., Murray Hill, N.J.

[21] Appl. No.: 814,817

[22] Filed: Mar. 11, 1997

[51] Int. Cl.[6] .................................................. H01L 29/00
[52] U.S. Cl. .................................... 257/510; 257/620
[58] Field of Search .............................. 257/500, 510, 257/620, 622

[56] References Cited

U.S. PATENT DOCUMENTS 5,623,159   4/1997   Monk et al. ............................ 257/500

FOREIGN PATENT DOCUMENTS 3-178161   8/1991   Japan ..................................... 257/510

Primary Examiner—Mark V. Prenty

[57] ABSTRACT

The specification describes techniques for isolating noisy subcircuits in integrated analog/digital devices. The isolating means are trenches formed in the backside of the chip, and extending through, or partially through, the chip substrate. The isolating trenches are configured to be discontinuous so that the structural integrity of the chip, and the wafer as the chips are processed, is preserved.

8 Claims, 4 Drawing Sheets

SUBSTRATE ISOLATION FOR ANALOG/DIGITAL IC CHIPS

FIELD OF THE INVENTION

This invention relates to integrated circuit devices with mixed signal components, e.g. analog and digital sections in the same IC substrate.

BACKGROUND OF THE INVENTION

Recent advances in IC design and fabrication make possible the integration of analog and digital circuits on the same IC chip. However, the analog signals are susceptible to interference and the presence of digital signals, or high level analog signals which swing the full voltage range ("aggressor"), in the vicinity of analog components allows the digital interference to couple directly into the analog sections ("victim") of the IC chip.

Isolation of electrical signals in IC devices has been addressed in the prior art, and a variety of approaches have developed. Complete isolation has been achieved in power ICs with dielectrically isolated structures. This approach is effective, but costly, and it consumes significant chip area. Junction isolation, i.e. guard rings, is the technique of choice in densely packed VLSI devices. Junction isolation is effective in blocking stray signals that propagate in the vicinity of the surface of the device. However, in ICs that are formed in epitaxial material, where the epitaxial layer is grown on a low resistivity substrate, an additional stray signal path extends vertically through the epi layer and into the low resistivity substrate. Once the signal reaches the substrate it can stray unimpeded to any region of the chip. A proposal for dealing with interference in the substrate is to increase the resistivity of the substrate. Silicon on sapphire (SOS) and similar technologies have been developed which provide a high degree of isolation, but these types of wafers are more difficult to process and are not economical for many applications.

Another approach to IC isolation that was explored in the early 1980s was the use of trenches between circuit components. V-groove trenches were found to consume excessive chip area. The advent of effective anisotropic plasma etching techniques, with which narrow trenches a few microns deep could be routinely formed, was also proposed for isolation. Techniques involving trenches of either kind required backfilling to allow further planar processing, and were, overall, complex and expensive.

A very recent proposal for the specific problem of isolation between analog and digital subcircuits on a common epi chip is described by Basedau et al in "A Post Processing Method for Reducing Substrate Coupling in Mixed-Signal Integrated Circuits", 1995 Symposium on VLSI Circuits Digest of Technical Papers, pp. 41,42, 1995. They propose a trench from the back of the chip. Such a approach has two advantages: it consumes less active chip area than front side trenches, and it does not require filling to produce a planar surface. The Basedau et al proposal is to etch between the analog/digital chip sites from the back side of the wafer, through the wafer thickness, using a crystallographic etch process, thus physically removing the silicon between chip sites. The v-groove thus formed consumes area mostly on the back side of the wafer. Since the typical crystallographic etch has reasonable selectivity between silicon and the field oxide it is proposed by Basedau et al that the etch will stop at the field oxide leaving the field oxide to physically connect the chips together. Although Basedau et al expect that the oxide itself has sufficient strength to maintain the structural integrity if the integrated chip, even fine cracks in the oxide can produce similar cracks or defect sites in the metallization that overlies the oxide, i.e. the interconnections between the digital and analog sectors of the chip. Consequently, to avoid yield problems resulting from the impaired structural integrity of the wafer it is likely that this technique would be practiced by separating the chips at the v-groove etch step, and remounting them in a multichip package.

SUMMARY OF THE INVENTION

We propose an isolation technique for analog/digital subcircuits in a single chip implementation which uses trench isolation but maintains the physical integrity of the wafer so that the advantages of analog/digital circuit integration is fully realized. The technique is based on the recognition that the current paths that the digital interference signals follow can be impeded sufficiently by blocking the direct path between the aggressor nodes and the victim nodes. Thus the trenches are placed selectively in the path of the interference signals. This allows a trench structure in which no trenches intersect, and avoids the complete physical separation of the substrate for the analog and digital chips as taught in the prior art. According to a second aspect of the invention, isolation is enhanced using a combination of trenches, as just described, with guard rings. The lateral propagation of interference signals though the epitaxial layer near the surface of the IC can be blocked effectively guard ring structures, so it is only necessary to block propagation of interference signals though the substrate. This recognition allows effective blocking of interference signals with trenches that extend partially through the thickness of the wafer leaving the surface of the wafer physically intact. Using this technique, less active chip area is consumed by the isolating barriers. Preserving the wafer surface intact not only increases the structural integrity of the wafer, but allows the isolating barrier formation step to be performed at any stage in the process that is convenient and cost effective. Usually it is advantageous to perform severe processing steps, i.e. steps that are more likely to result in wafer defects, early in the IC process. Wafer yield is improved by this process flexibility.

DETAILED DESCRIPTION

Figure 1:
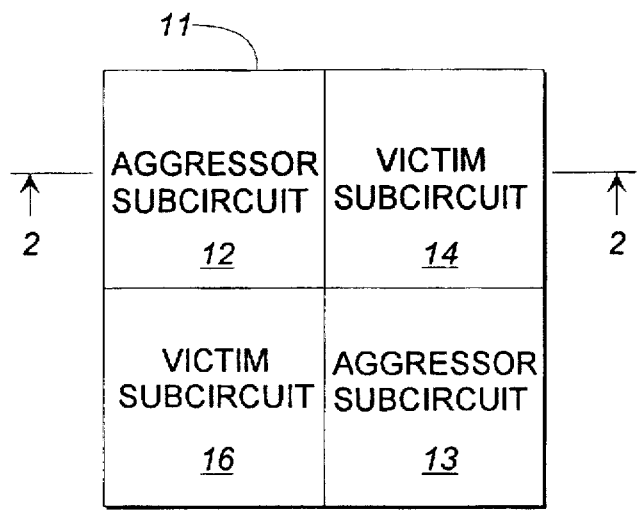
FIG. 1 is a schematic plan view of an analog/digital multicircuit chip layout showing the linear boundaries between subcircuit segments.

Referring to FIG. 1, the layout of an analog/digital chip 11 is represented schematically with two "noisy" circuits, i.e.

digital circuits, represented at 12 and 13, and two "sensitive" subcircuits, i.e. the analog circuits represented at 14 and 15. While this combination is chosen as an example, the combination could also consist of or comprise analog circuit subsections with high level analog signal interference between them.

It will be evident to those skilled in the art that FIG. 1 shows the worst case layout, with potential interference across all four boundaries shown. In the usual case the circuit designer would attempt to group the sensitive circuits and place them more favorably from the standpoint of avoiding interference.

Figure 2:
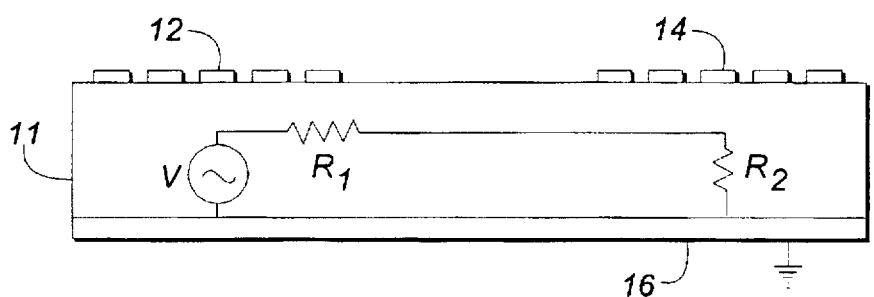
FIG. 2 is a sectional view though 2—2 of FIG. 1 showing the noise interaction between adjacent subcircuit segments.

The propagation of interference signals between circuit segments is illustrated by FIG. 2 which is a schematic section through 2—2 of FIG. 1. The noise from the subcircuit 12 is represented by noise voltage V (rms), the resistance to that noise spreading to the adjacent subcircuit 14 is represented by $R_1$, and the resistance from the subcircuit 14 to ground 16 is represented by $R_2$. The voltage interaction I between subcircuit 12 and subcircuit 14 is given by:

$$V_I = V \times R_2/R_1 + R_2 \quad (1)$$

It is evident that to minimize the interference $V_I$ it is desirable that $R_1$ be large.

Figure 3:
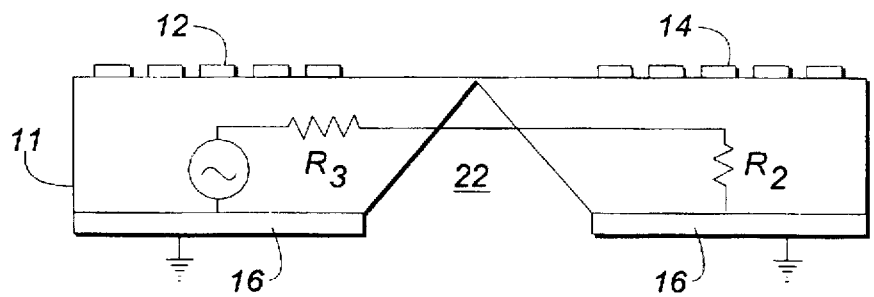
FIG. 3 is a view similar to that of FIG. 2 illustrating an isolation trench used in the embodiments of the invention.

According to a first aspect of the invention, the resistance $R_1$ is increased substantially by constructing isolation trenches along the boundaries of FIG. 1 in the manner shown in FIG. 3. The isolation trench is shown at 22, and in the most general case penetrates through the chip thickness thereby changing the resistance of the lateral path between subcircuit sites to $R_3$, where now $R_3 \gg R_1$.

Figure 4:
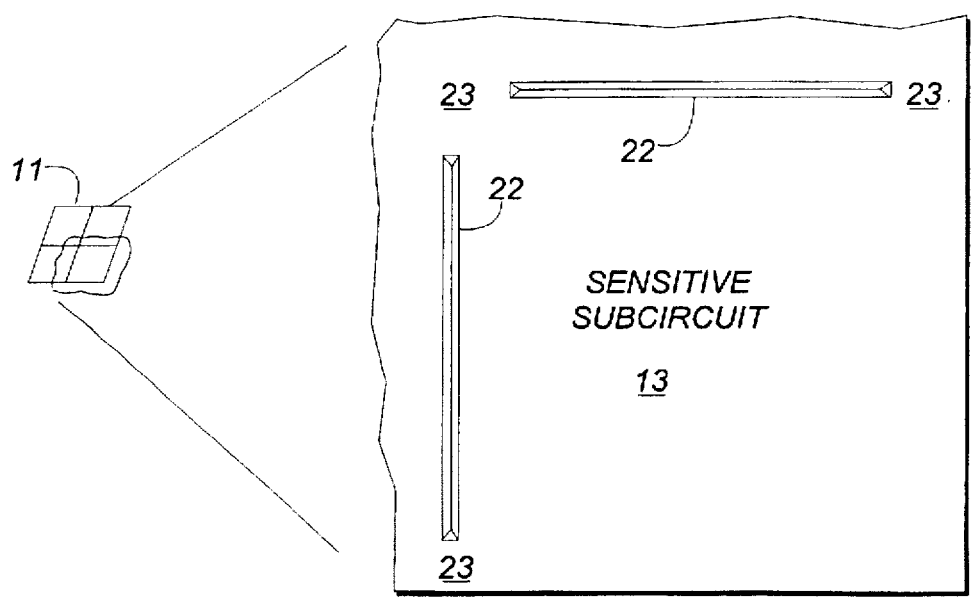
FIG. 4 is a plan view of a subcircuit segment showing one embodiment of the invention.

The isolation trenches do not surround the subcircuit segments but are spaced, as shown in one embodiment in the plan view of FIG. 4, to preserve the structural integrity of the wafer as it is processed, and the chips as they are mounted and used in service. In the embodiment of FIG. 4, only a portion of the chip 11 is shown for simplicity. The trenches appear at 22, and are deliberately spaced from the edge of the chip by regions 23 so that the substrate at the edge of the chip has the original thickness and maximum strength. The trenches are separated one from another by regions 23, also where the original thickness of the chip is retained for structural integrity. The spacing between trenches, i.e. the length of the regions 23, as measured along the boundary separating the subcircuit segments, is a matter of choice for the circuit and process designers. The objective of the invention would be realized in most cases if the substrate along the boundary between the sensitive and noisy subcircuits is at least 10% intact through its thickness, and preferably 20%. As an example, using the configuration of FIG. 2, if the circuit subsection 13 measures 50 mils square, then the trenches 22 are recommended to be 40 mils in length, and the spaces 23 are recommended to be 5 mils. The actual spacing between adjacent trenches along a given boundary, viewing all the circuit subsections, will be 10 mils.

While the trench length will be dictated largely by the subcircuit dimensions as just described, the trench width is more of a design choice. From an electrical point of view the width of the trench is immaterial, the narrowest trench will do. Substrate strength considerations also favor narrow trenches. If the crystallographic etch technique described below is used to form the trenches the minimum trench width will depend on the thickness of the substrate, and the depth of the trench. Assuming a <001> crystal orientation for a silicon substrate and a trench that extends through the thickness of the substrate the minimum width of the trench is given by:

$$\tan 35.3° = W/2t \quad (2)$$

where 35.3° is the angle the etch plane makes with the normal to the trench, W is the width of the trench, and t the thickness of the substrate. The recommended trench width is in the approximate range of 1.4 to 2 times the substrate thickness.

It should be understood that the Figures show a single chip site which is but one of a plurality on a wafer. Again for simplicity the wafer level figures are not shown. However, it should be understood that the formation of the isolation trenches is preferably performed at the wafer level, which is an advantage of this invention over the prior art.

Figure 5:
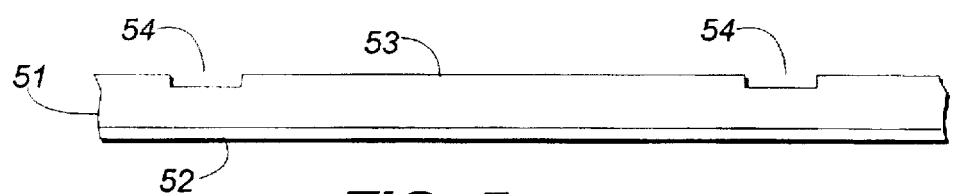
FIGS. 5 and 6 are schematic representations of processing suitable for forming the isolating trenches of the invention.
Figure 6:
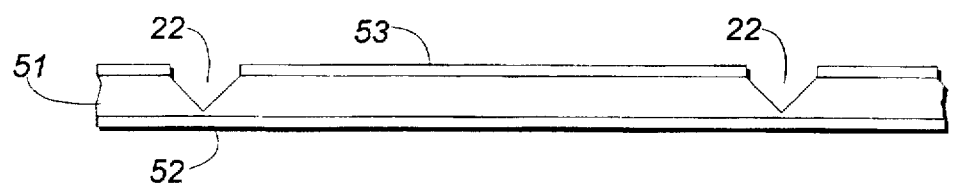

A suitable technique for forming the isolation trenches is described in connection with FIGS. 5 and 6. FIG. 5 shows a portion of a wafer being processed at the beginning of the process, i.e. before formation of the circuit components. The substrate 51 is preferably a silicon wafer with a <100> orientation. Wafer 51 is shown with a field oxide 52 on the active side of the wafer, i.e. where the components are to be formed. The substrate is inverted in this illustration to allow processing of the obverse side of the wafer. An oxide layer is grown or deposited on the surface of the wafer and is patterned by standard photolithography to form an oxide mask 53 with openings 54. The openings 54 have a configuration matching that of the desired trenches represented by 22 in FIGS. 3 and 4. The masked wafer is then etched using a crystallographic etch such as KOH, or if the components are alkali sensitive an EDTA etch can be used. As is known in the art the crystallographic etch will etch preferentially along <111> crystal planes and will form the V-shaped trench as shown in FIG. 3.

Optionally this process can be performed using a photomask in place of the oxide mask 54. However, due to the severity of the etch process the use of an oxide hardmask may be preferred.

Figure 7:
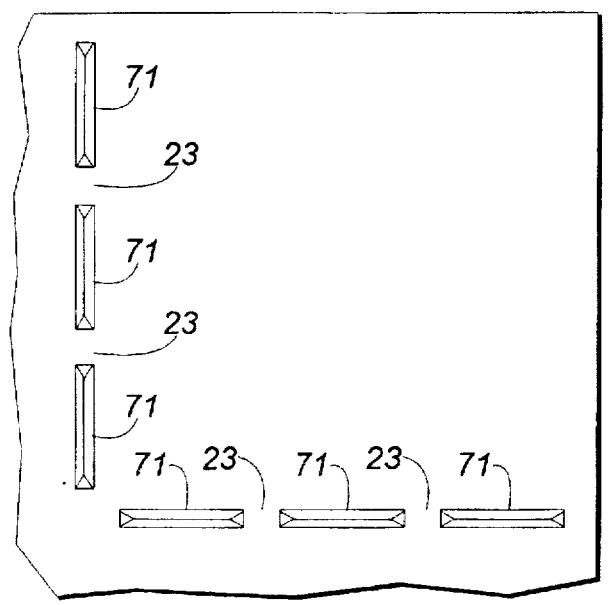
FIGS. 7–9 are plan views similar to that of FIG. 4 showing alternative forms of the invention.

Another embodiment of the invention is shown in FIG. 7 wherein the trench along the subcircuit boundary is segmented into several trenches 71, thus adding additional regions 23 for more substrate integrity. The resistance of the path $R_3$ between the subcircuit segments is reduced somewhat over the embodiment of FIG. 4 but is still substantial leaving the designer with a tradeoff between the substrate integrity and the intersegment resistivity.

Figure 8:
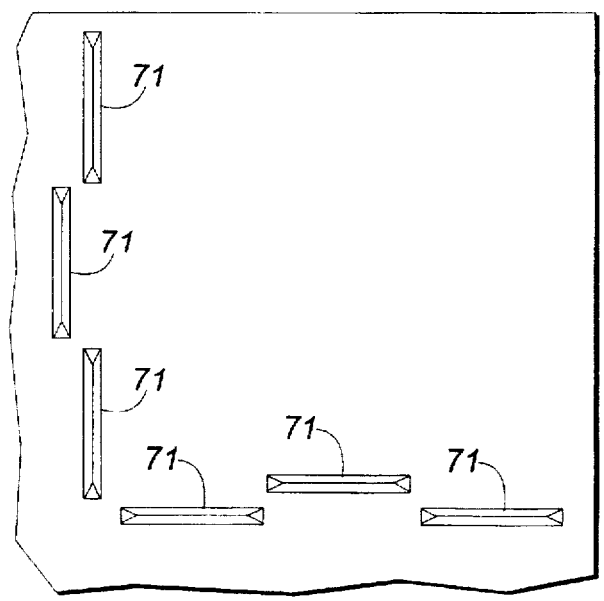

Those skilled in the art, and familiar with scribe and break techniques, will identify the potential for breakage along the direction of end to end trenches 71 if the regions 23 are small. To eliminate this as a potential fracture line, the trenches can be offset slightly as shown in FIG. 8. The offset allows the trenches to be spaced more closely end to end, essentially eliminating any direct electrical noise path between subcircuit segments.

Figure 9:
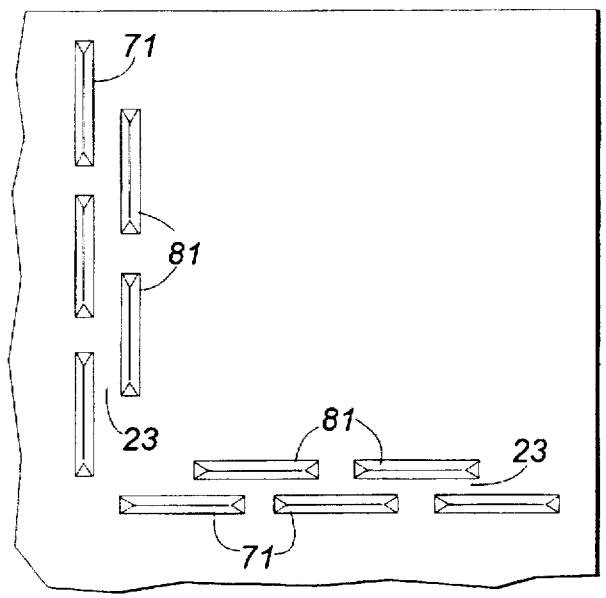

The resistivity $R_3$ in the structures of FIGS. 7 and 8 can be even further increased by constructing overlapping trenches as shown in FIG. 9. The overlapping trenches are shown at 81. The structural integrity of the wafer is reduced somewhat by comparison to the structure of FIG. 7, but both the structural integrity and the resistivity are improved over the structure of FIG. 4. Since the trenches are typically narrow in width, as described above, the rows 71 and 81 can be placed close together without detracting significantly from substrate strength.

Figure 10:
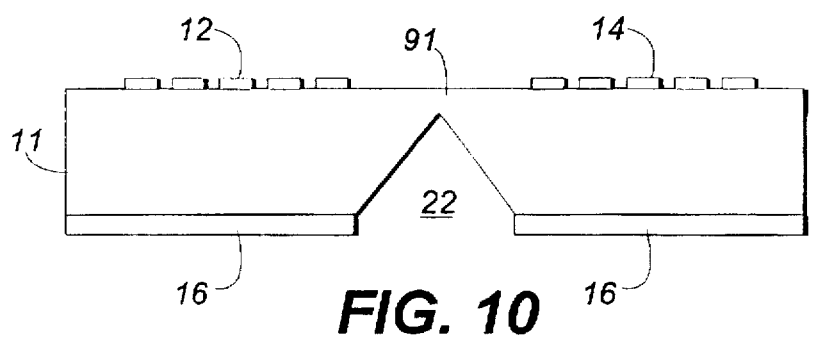
FIGS. 10 is a sectional view through the device substrate showing a preferred structure for the isolating trench of the invention.

As indicated earlier, it is desirable to perform the etch step and form the isolation trenches early in the process sequence. To realize this objective the embodiment shown in FIG. 10 is a preferred approach. Here the substrate is shown with an epitaxial layer 91 on the substrate 11, in which the active devices are formed. The isolation trenches, represented by 22 in the Figure, extend only partially through the thickness of the substrate 11, leaving the epitaxial layer and the surface of the substrate intact. The surface remains planar to accommodate subsequent planar processing steps for forming the active devices. This structure also has added structural integrity due to the continuity of the substrate at the surface. If the epitaxial layer 91 is of the order of 20 microns and the wafer thickness is of the order of 200 microns the isolation trench should penetrate approximately 90% of the wafer thickness.

Etch control in making the structure of FIG. 10 is challenging using an isotropic wet etch, even though the crystallographic etch tends to stop at the point where the <111> planes intersect. The mask that determines the trench width at the etch surface will aid in limiting the etch depth to 90% of the substrate thickness, in the case given, if the mask opening equals W, in equation (2), and the t term in the equation is 0.9 times the actual wafer thickness. However, as an added tool to insure that the etch process stops at the appropriate point, i.e. the apex of the V-shaped trench stops at the approximate bottom of the epi layer, a dopant selective etch such as ethylenediaminetetraacetic acid (EDTA), or other appropriate dopant selective material or process, can be used during the later stages of the etch process to ensure that material removal ceases at the approximate interface between the substrate and the epitaxial layer as shown in FIG. 10.

Figure 11:
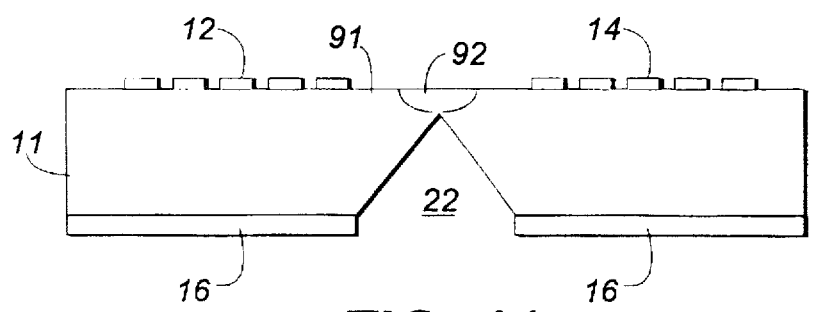
FIG. 11 is a sectional view similar to that of FIG. 10 illustrating the use of a combination of isolating trench with a junction guard ring.

With the isolation trench terminating at the epi-substrate interface there is potential for unwanted noise propagating through the epi layer. Accordingly, in this structure it is preferred to have a junction guard ring 92 around the subcircuits to be isolated as shown in FIG. 11. Junction guard rings are well known in the art and need not be described in detail. The combination of isolation trenches, for blocking noise paths through the substrate, and junction guard rings for blocking the noise path through the epi layer, results in a chip with structural integrity and essentially complete subcircuit isolation.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. Integrated circuit comprising:
    a. a substrate, said substrate having a backside and a front side,
    b. at least two subcircuits on the front side of said substrate including a first subcircuit having analog devices and a second subcircuit having digital devices, with a linear boundary between said subcircuits, and
    c. isolating means contained within said substrate along said linear boundary, said isolating means comprising: a row of V-shaped trenches situated along said boundary and placed end to end, said V-shaped trenches extending from the backside of said substrate substantially through the thickness of said substrate, said row of trenches having spaces with length L between the trenches, with the aggregate of the spaces L being at least approximately 10% of the length of said linear boundary.

2. The integrated circuit of claim 1 further including an epitaxial layer on said substrate and in which the V-shaped trenches extend just through said substrate leaving said epitaxial layer intact.

3. The integrated circuit of claim 2 further including a junction guard ring in said epitaxial layer along said linear boundary.

4. The integrated circuit of claim 1 in which the trenches extend essentially end to end along said boundary with adjacent trenches offset with respect to said linear boundary.

5. The integrated circuit of claim 1 in which said isolating means comprises two rows of said V-shaped trenches extending along said linear boundary, said first row of trenches comprising a sequence of a trench and a space and the second row of trenches comprising a sequence of a trench and a space, the trenches in said two rows being staggered respectively so that a space in one row is situated beside a trench in the other row.

6. The integrated circuit of claim 1 in which the width of the trench is between 1.4 and 2 times the thickness of the substrate.

7. Integrated circuit comprising:
    a. a substrate, said substrate having a backside and a front side, and an epitaxial layer on the front side of said substrate,
    b. at least two subcircuits formed in said epitaxial layer on the front side of said substrate including a first subcircuit having analog devices and a second subcircuit having digital devices, with a linear boundary between said subcircuits, and
    c. isolating means contained within said substrate along said linear boundary, said isolating means comprising: a V-shaped trench situated along said linear boundary, said V-shaped trench extending from the backside of said substrate substantially through the thickness of said substrate leaving the epitaxial layer intact, said trench extending no more than approximately 90% of the length of said linear boundary.

8. Integrated circuit comprising:
    a. a substrate, said substrate having a backside and a front side, and an epitaxial layer on the front side of said substrate,
    b. at least two subcircuits formed in said epitaxial layer on the front side of said substrate including a first subcircuit having analog devices and a second subcircuit having digital devices, with a linear boundary between said subcircuits,
    c. a junction guard ring in said epitaxial layer along said linear boundary, and
    d. isolating means contained within said substrate along said linear boundary, said isolating means comprising: a V-shaped trench situated along said linear boundary, said V-shaped trench extending from the backside of said substrate substantially through the thickness of said substrate leaving the epitaxial layer intact, said trench extending no more than approximately 90% of the length of said linear boundary.

* * * * *